United States Patent
Du et al.

(10) Patent No.: US 12,096,141 B2
(45) Date of Patent: Sep. 17, 2024

(54) LOFIC CIRCUIT FOR IN PIXEL METAL-INSULATOR-METAL(MIM) CAPACITOR LAG CORRECTION AND ASSOCIATED CORRECTION METHODS

(71) Applicant: OMNIVISION TECHNOLOGIES, INC., Santa Clara, CA (US)

(72) Inventors: Yifei Du, San Jose, CA (US); Zhiqiang Lin, Fremont, CA (US); Bill Phan, Sunnyvale, CA (US); Woon Il Choi, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 88 days.

(21) Appl. No.: 18/154,715

(22) Filed: Jan. 13, 2023

(65) Prior Publication Data
US 2024/0244344 A1 Jul. 18, 2024

(51) Int. Cl.
*H04N 25/59* (2023.01)
*H01L 27/146* (2006.01)
*H04N 25/771* (2023.01)

(52) U.S. Cl.
CPC ....... *H04N 25/59* (2023.01); *H01L 27/14612* (2013.01); *H01L 27/14643* (2013.01); *H04N 25/771* (2023.01)

(58) Field of Classification Search
CPC ........ H04N 25/59; H04N 25/76; H04N 25/77; H01L 27/14612; H01L 27/14643; H01L 27/14609
See application file for complete search history.

(56) References Cited

U.S. PATENT DOCUMENTS

| 10,044,960 | B2 | 8/2018 | Mao et al. |
| 10,063,797 | B2 | 8/2018 | Vampola et al. |
| 11,330,207 | B1 | 5/2022 | Dierickx |
| 2004/0041077 | A1 | 3/2004 | Fossum |
| 2017/0347047 | A1 | 11/2017 | Mao et al. |
| 2018/0234652 | A1* | 8/2018 | Sugawa ............ H04N 25/78 |

(Continued)

OTHER PUBLICATIONS

U.S. Appl. No. 17/849,403, filed Jun. 24, 2022.

(Continued)

*Primary Examiner* — Kelly L Jerabek
(74) *Attorney, Agent, or Firm* — Perkins Coie LLP

(57) ABSTRACT

A pixel circuit includes a photodiode configured to photogenerate image charge in response to incident light. A floating diffusion is coupled to receive the image charge from the photodiode. A transfer transistor is coupled between the photodiode and the floating diffusion. The transfer transistor is configured to transfer the image charge from the photodiode to the floating diffusion. A reset transistor is coupled between a reset voltage and the floating diffusion. A lateral overflow integration capacitor (LOFIC) network is coupled between the reset transistor and a bias voltage source. The LOFIC network includes a main LOFIC coupled between the reset transistor and the bias voltage source, and a plurality of subordinate capacitor-switch pairs, each including a subordinate LOFIC and a switch transistor coupled to the subordinate LOFIC. Each of the plurality of subordinate capacitor-switch pairs is coupled between the reset transistor and the bias voltage source.

20 Claims, 9 Drawing Sheets

(56) References Cited

U.S. PATENT DOCUMENTS

| | | | |
|---|---|---|---|
| 2021/0168312 A1* | 6/2021 | Madurawe | H01L 27/14609 |
| 2021/0183926 A1* | 6/2021 | Choi | H01L 27/14643 |
| 2022/0053152 A1 | 2/2022 | Ikuma et al. | |
| 2023/0164460 A1* | 5/2023 | Park | H04N 25/771 |
| | | | 348/230.1 |
| 2023/0353898 A1* | 11/2023 | Tatsuta | H04N 25/77 |
| 2023/0361164 A1 | 11/2023 | Tsai et al. | |

OTHER PUBLICATIONS

U.S. Appl. No. 17/849,325, filed Jun. 24, 2022.
U.S. Appl. No. 17/808,896, filed Jun. 24, 2022.
U.S. Appl. No. 17/849,354, filed Jun. 24, 2022.
U.S. Appl. No. 17/808,899, filed Jun. 24, 2022.

* cited by examiner

LOFIC CIRCUIT FOR IN PIXEL METAL-INSULATOR-METAL(MIM) CAPACITOR LAG CORRECTION AND ASSOCIATED CORRECTION METHODS

TECHNICAL FIELD

This disclosure relates generally to image sensors, and in particular but not exclusively, relates to high dynamic range (HDR) complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and photogenerate image charge upon absorption of the image light. The image charge photogenerated by the pixels may be measured as analog output image signals on column bitlines that vary as a function of the incident image light. In other words, the amount of image charge photogenerated is proportional to the intensity of the image light, which are read out as analog signals from the column bitlines and converted to digital values to produce digital images (i.e., image data) that represent the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
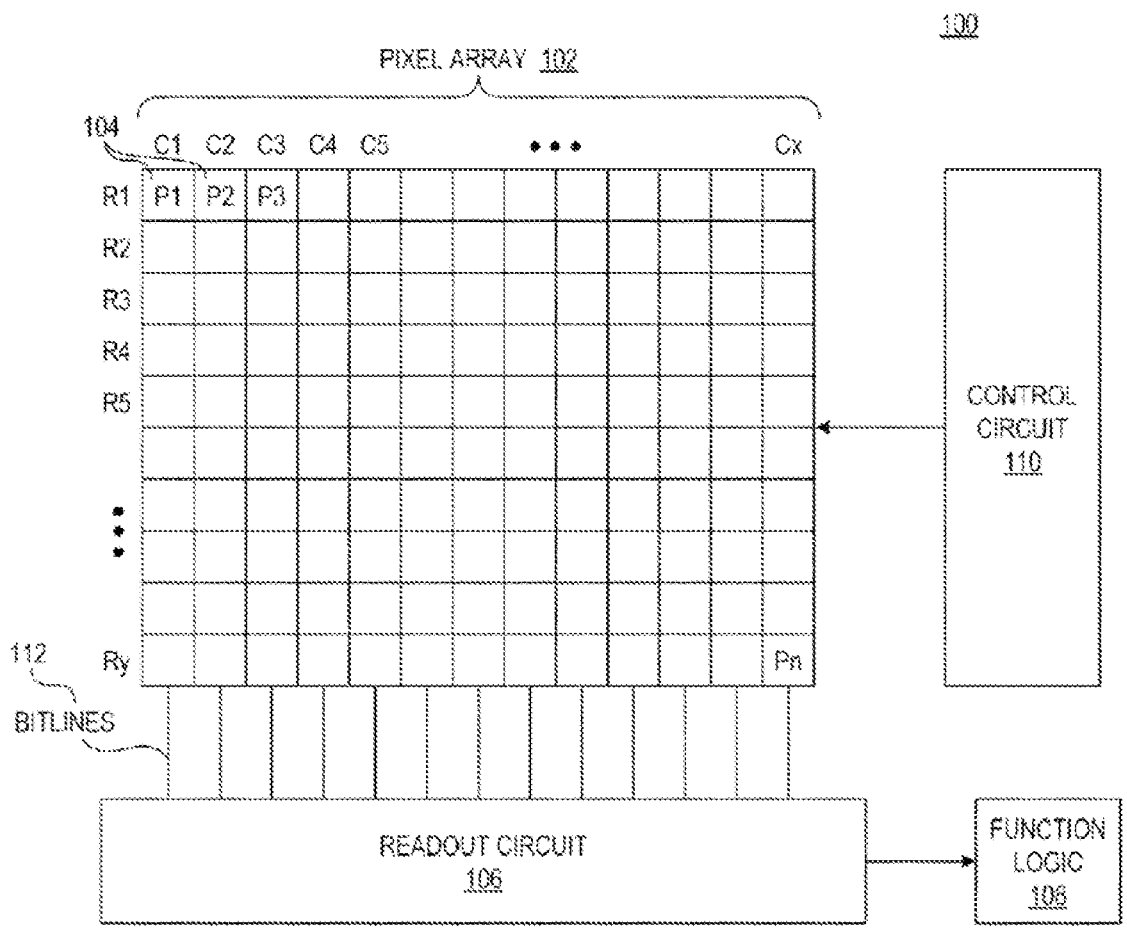
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a pixel array including pixel circuits, each with a LOFIC network providing reduced image lag, are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system include a pixel array with pixel circuits, each with a LOFIC network configured to provide reduced image lag, are disclosed. It is appreciated that LOFICs may be included in pixel circuits to increase the full well capacity of the pixel circuits and thereby increase high dynamic range capabilities of corresponding image sensors. LOFIC capacitance is positively correlated with full well capacity. Thus, as the capacitance of a LOFIC employed in a pixel circuit increases, the full well capacity of the pixel circuit also increases. For this reason, higher LOFIC capacitance is commonly desired. However, due to the huge RC loading as the capacitance of a LOFIC increases, the time required for row drivers of the imaging system to charge and/or reset the LOFIC also increases, causing slower frame rates. Furthermore, as the capacitances of LOFICs in pixel circuits increase, image lag increases, which affects image quality.

It is appreciated that the image lag caused by LOFICs can be associated with the high dielectric constant or high-k material included in the insulation material of metal-insulator-metal (MIM) LOFICs due to the hysteresis characteristics and slow relaxation behavior of high-k materials that requires long discharge time (e.g., hundreds of milliseconds). The high-k material relaxation behavior can cause the degraded image quality such as image lag due to many mechanisms including trap-to-trap tunneling, structural relaxation, coupling with phonon energy, etc.

As will be shown in the various examples below, an example pixel circuit includes a photodiode configured to photogenerate image charge in response to incident light. A floating diffusion is coupled to receive the image charge from the photodiode. In one example, a reset transistor is coupled between a bias voltage source and the floating diffusion. In another example, the reset transistor is coupled between a reset voltage source and the floating diffusion. The reset transistor is configured to be switched in response to a reset control signal.

In the various examples, the pixel circuit also includes a LOFIC network providing additional storage capacity configured to store overflow image charge for high dynamic range (HDR) image acquisition. In various examples, the LOFIC network includes a main LOFIC and two or more subordinate capacitor-switch pairs, each including a subordinate LOFIC and a switch transistor coupled to the subordinate LOFIC. In various examples, the main LOFIC and each of the subordinate capacitor-switch pairs are coupled to one another in parallel. In the various examples, each of the LOFICs is a metal-insulator-metal (MIM) storage capacitor that includes a high-k insulating region disposed between a first metal electrode and a second metal electrode. In the various examples, the first metal electrode of the main LOFIC and each of the subordinate LOFICs is coupled to a bias voltage source and the second metal electrode of each of the subordinate LOFICs is coupled to the switch transistor of the same subordinate capacitor-switch pair, which is coupled to the reset transistor locally through one or more circuit elements of the pixel circuit including the floating diffusion of the pixel circuit. In various examples, the second metal electrode of the main LOFIC is similarly coupled to the reset transistor. In various examples, the LOFIC network includes a main switch transistor and the second metal electrode of the main LOFIC is coupled to the main switch transistor, which is coupled to the reset transistor locally through one or more circuit elements of the pixel circuit including the floating diffusion of the pixel circuit. In various examples, the main LOFIC and the subordinate LOFICs have the same dielectric composition, the same dielectric thickness, and/or the same biasing scheme (e.g., to have similar operation conditions). In various examples, the main LOFIC has a greater capacitance area than each of the subordinate LOFICs.

Image lag is caused by the slow discharge of residual charges in LOFICs, which may cause a pixel circuit to be unable to keep up with the desired image sensor frame rate. If the residual charges from a prior frame(s) are not sufficiently discharged, they show up in the next frame, resulting in undesirable image lag and image artifacts (e.g., ghost image or lag image). A LOFIC network in accordance with the teachings of the present disclosure includes subordinate LOFICs for sensing accumulated residual charges in the previous frames by alternatingly coupling them to the rest of the pixel circuit during the integration period on a frame-by-frame basis. In one example, in each frame period of the image sensor, only a single switch of the subordinate capacitor-switch pairs of the LOFIC network is on during the integration period such that one subordinate LOFIC is exposed at the same time as a main LOFIC and modeling the lag characteristic of the main LOFIC during that frame (e.g., amount of residual charges being accumulated and discharged over previous one or more frames for lag compensation), and at least one other subordinate LOFIC is operated in discharge mode. As the image sensor moves on to the next frame, the previously on switch transistor is turned off and a different switch transistor is simultaneously turned on during the integration period. In other words, in one example, the multiple switch transistors alternate being on, with only one of the switch transistors on during the integration period in a given frame, so that the subordinate LOFICs coupled to the switch transistors that are simultaneously off can discharge residual charges prior to the frame in which their corresponding switch transistors would be turned on. Accordingly, a subordinate LOFIC storing charges from its active frame period has plenty of idle period to fully relax and sufficiently discharge before the integration period in its next active frame. The number of subordinate capacitor-switch pairs may depend on the frame rate desired and how much time a LOFIC needs to sufficiently discharge (e.g., more than 10 ms, more than 100 ms). For example, if a subordinate LOFIC takes 30 ms to sufficiently discharge and a frame rate of 30 frames per second (fps) is desired (each frame lasts about 33 ms), the LOFIC network should have at least two subordinate capacitor-switch pairs. The number of subordinate capacitor-switch pairs may also depend on the image lag reduction level desired, the number of frames to be accounted for in determining lag compensation, and/or pixel size.

In various examples, the LOFIC network includes a main switch transistor to which the main LOFIC is coupled, selectively coupling the main LOFIC to the pixel circuit. The main switch transistor can be configured to remain on during all frame periods, allowing charges to overflow from the coupled photodiode and discharge from the main LOFIC during signal readout.

In various examples, the LOFIC network does not include a switch transistor for the main LOFIC. That is, the main LOFIC is always coupled between the reset transistor and the floating diffusion. Thus, the main LOFIC is active during every frame and does not have enough time to fully relax and sufficiently discharge before the integration period in the next frame. Instead of discharging the residual image charges on the main LOFIC, image lag accumulated in the main LOFIC is compensated for based on the image lag accumulated in the subordinate LOFICs that are inactive during that frame. The pixel circuit reads out a first signal in response to image charge from the main LOFIC and the subordinate LOFIC that were active during the integration period of that frame. The first signal includes the lag-free signal specific to that frame and image lag from the main LOFIC (the subordinate LOFIC that is active during that frame is presumed to not have any image lag). The pixel circuit then reads out, during the same frame, a second signal in response to image charge from all LOFICs (i.e., the main LOFIC and all subordinate LOFICs, whether they were active or inactive during the integration period of that frame). The second signal includes the lag-free signal specific to that frame, image lag from the main LOFIC, and various levels of image lag from the subordinate LOFICs that were inactive during the integration period of that frame, but were active during one or more previous frames. In other words, the second signal is the first signal combined with the image lag from the inactive subordinate LOFICs. Therefore, the pixel circuit can compensate for the image lag measured from the inactive subordinate LOFICs by subtracting the first signal from the second signal (hereinafter "subordinate LOFICs lag signal").

In various examples, image lag accumulated in a capacitor is presumed to be proportional to the capacitance of the capacitor. Therefore, the image lag ratio between the main LOFIC and a subordinate LOFIC is presumed to be equivalent to the capacitance ratio between the main LOFIC and the subordinate LOFIC. If there are more than two subordinate LOFICs in the LOFIC network, the subordinate LOFICs lag signal represents image lag from multiple subordinate LOFICs captured during previous frames. The main LOFIC image lag can be compensated for by proportionally scaling the subordinate LOFICs lag signal (e.g., calculating a quotient by dividing the subordinate LOFIC lag signal by the number of inactive subordinate LOFICs), then multiplying (i.e., calculating a product of) the result by the capacitance ratio. The capacitance of a capacitor is proportional to the capacitance area, and inversely proportional to the dielectric thickness. Therefore, if the main LOFIC and each of the subordinate LOFICs have the same dielectric composition and dielectric thickness, the capacitance ratio can be replaced by the area ratio. Using smaller subordinate LOFICs allows the use of a smaller wafer. The LOFIC network and the lag correction methods in accordance with the teachings of the present disclosure break some of the constraints (associated with lag issues) on the maximum 3D or trenched capacitor size. Then, the lag-free signal can be determined by subtracting the compensated main LOFIC image lag from the first signal.

To illustrate, FIG. 1 shows one example of an imaging system 100 having a pixel array with pixel circuits each including a LOFIC network providing reduced image lag in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in the one or more photodiodes is transferred to a floating diffusion included in each pixel circuit 104, which may be converted to an image signal, which is then read out from each pixel circuit 104 by readout circuit 106 through column bitlines 112. As will be discussed, in the various examples, pixel circuits 104 are also be configured to provide HDR image signals, in which case, the image charge generated by the one or more photodiodes in bright lighting conditions may also be transferred to the LOFIC network and/or an additional floating diffusion in each pixel circuit 104 to store the image charge. For example, each pixel circuit 104 may include a LOFIC network configured to store excess image charges that overflow from the coupled one or more photodiodes during an integration period. In the various examples, readout circuit 106 may be configured to read out the image signals through column bitlines 112. In various examples, readout circuit 106 may include current sources, routing circuitry, and comparators that may be included in analog to digital converters or otherwise.

In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise). In various examples, function logic 108 may include circuitry or logic for performing image lag compensation (e.g., performing signal subtraction to determine the lag-free signal). Function logic 108 may be implemented in an image signal processor (ISP).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
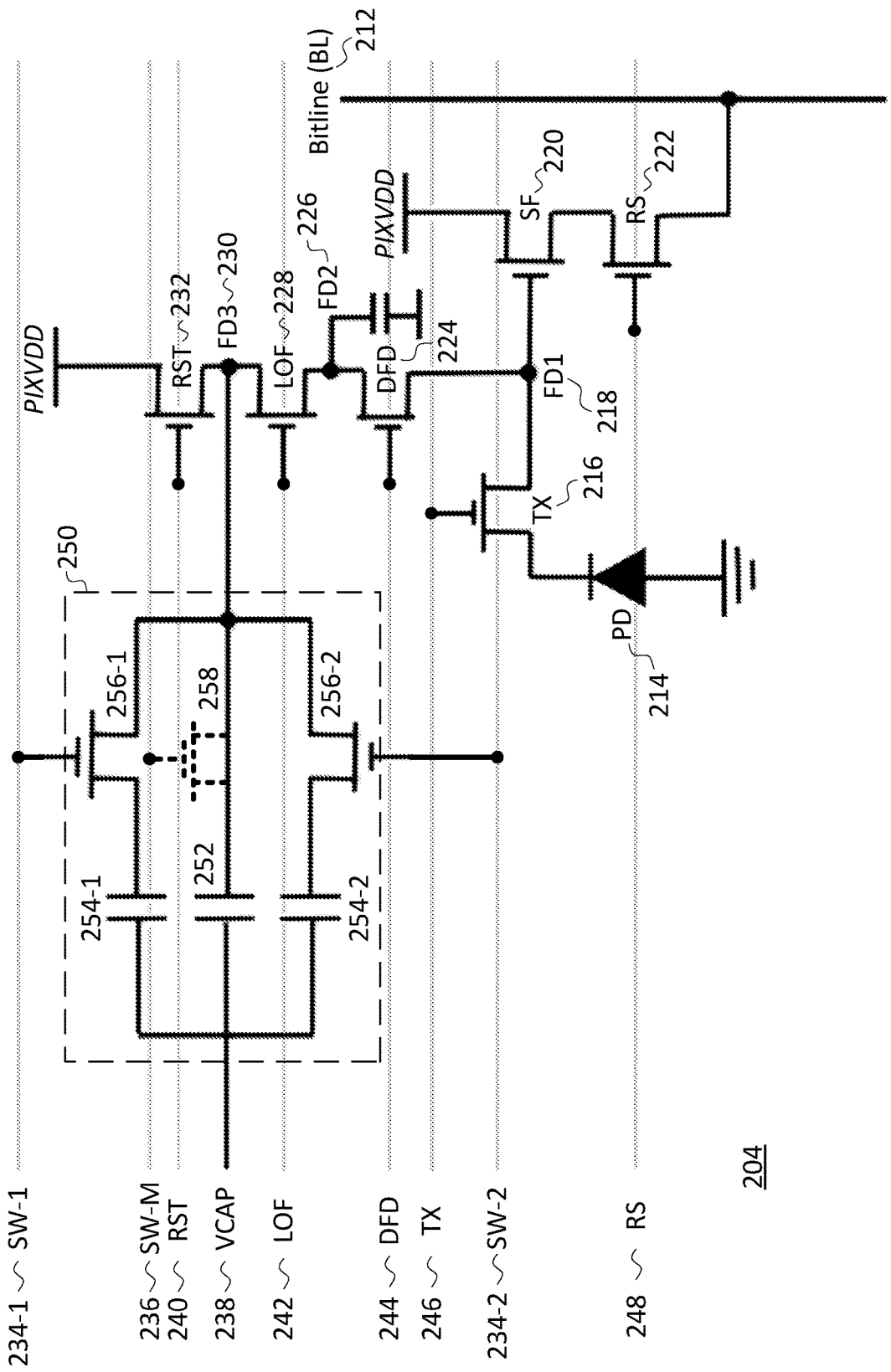
FIG. 2 illustrates a schematic of one example of a pixel circuit including a lateral overflow integration capacitor (LOFIC) network and a photodiode in accordance with the teachings of the present disclosure.

FIG. 2 illustrates a schematic of one example of a pixel circuit 204 including a LOFIC network 250 and a photodiode 214 in accordance with the teachings of the present disclosure. It is appreciated that the pixel circuit 204 of FIG. 2 may be an example of one of the pixel circuits 104 included in pixel array 102 as shown in FIG. 1, and that similarly named and numbered elements described above are coupled and function similarly below.

As shown in the depicted example, pixel circuit 204 includes a photodiode 214, which is configured to photo-generate image charge in response to incident light. In the depicted example, pixel circuit 204 also includes a first floating diffusion FD1 218 coupled to receive the image charge from the photodiode 214 through a transfer transistor 216. In the example, the transfer transistor 216 is coupled to be controlled in response to a transfer control signal TX 246 to transfer image charge from the photodiode 214 to the first floating diffusion FD1 218, for example, during a readout period associated with the pixel circuit 204. A source follower transistor 220 has a gate coupled to the first floating diffusion FD1 218, and a row select transistor 222 is coupled to the source follower transistor 220 such that the source follower transistor 220 and the row select transistor 222 are coupled between a power line PIXVDD and a bitline 212 to output an image signal from the pixel circuit 204 in response to a row select control signal RS 248 and the amount of charge at the gate of the source follower transistor 220.

In the example illustrated in FIG. 2, a dual floating diffusion transistor 224 is coupled between the first floating diffusion FD1 218 and a second floating diffusion FD2 226. The second floating diffusion FD2 226 is coupled to a capacitor (e.g., junction capacitor) configured to receive excess image charge overflow from photodiode 214 through transfer transistor 216 and the dual floating diffusion transistor 224. The second floating diffusion FD2 226 is further coupled to a source of a LOFIC transistor 228. A third floating diffusion FD3 230 is coupled between the LOFIC transistor 228 and the reset transistor 232. A drain of reset transistor 232 is coupled to reset voltage source PIXVDD and a source of the reset transistor 232 is coupled to the third floating diffusion FD3 230. The dual floating diffusion transistor 224 is coupled to be controlled in response to a dual floating diffusion control signal DFD 244, the LOFIC transistor 228 is coupled to be controlled in response to a LOFIC transistor control signal LOF 242, and the reset transistor 232 is coupled to be controlled in response to a reset control signal RST 240.

As shown in the depicted example, pixel circuit 204 also includes a LOFIC network 250 coupled between a bias voltage source VCAP 238 and the third floating diffusion FD3 230. Therefore, it is appreciated that the LOFIC network 250 is selectively coupled to the first floating diffusion FD1 218 through the LOFIC transistor 228 and the dual floating diffusion transistor 224. The LOFIC network 250 is configured to receive excess image charge overflow from the photodiode 214 (e.g., under a bright light condition, such as IR or LED light).

In the example, the LOFIC network 250 includes a main LOFIC 252 and a plurality of subordinate capacitor-switch pairs coupled in parallel. In the illustrated embodiment, there are two subordinate capacitor-switch pairs. Each subordinate capacitor-switch pair includes a respective LOFIC 254-$n$ and a switch transistor 256-$n$ connected in series. The first and second switch transistors are coupled to be controlled in response to switch control signals SW-1 234-1 and SW-2 234-2, respectively. As will be discussed in the various examples, the subordinate LOFIC 254-1 or 254-2 in LOFIC network 250 that is inactive during the integration period of a frame is given enough time to relax and sufficiently discharge residual charges such that the remaining charge will not have an impact on a next captured frame during operation by alternatingly coupling and decoupling the subordinate LOFICs 254-1 and 254-2 from the rest of the pixel circuit on a frame-by-frame basis via the switch transistors 256-1 and 256-2. For example, in each frame period of the image sensor, only one switch transistor (e.g., 256-1) of the subordinate capacitor-switch pairs of the LOFIC network 250 is on during the integration period, and the other switch transistor (e.g., 256-2) is simultaneously turned off. As the image sensor moves on to the next frame, the other switch transistor (e.g., 256-2) is turned on during the integration period and the switch transistor that was on during the previous frame (e.g., 256-1) is simultaneously turned off. The subordinate LOFIC 254-$n$ coupled to the switch transistor 256-$n$ that is off during the integration period can discharge residual charges prior to the frame in which its corresponding switch transistor would be turned on. Accordingly, a subordinate LOFIC 254-$n$ storing charges from its active frame period has plenty of idle period to fully relax and sufficiently discharge before the integration period in its next active frame, reducing any undesirable image lag (e.g., visible artifacts on the captured frame).

In various examples, the LOFIC network 250 may also include a main switch transistor 258 to which the main LOFIC 252 is coupled. In the depicted example, the main switch transistor 258 is coupled to be controlled in response to a main switch control signal SW-M 236 for selectively coupling the main LOFIC 252 to the third floating diffusion FD3 230 to enable an overflow path between the photodiode 214 and the main LOFIC 252. In various examples, the main switch transistor 258 can be configured to remain on during all frame periods.

In various examples, the main switch transistor 258 is not included and the main LOFIC 252 is therefore active during every frame and does not have enough time to fully relax and sufficiently discharge before the next frame. Instead of discharging the residual image charges on the main LOFIC 252, image lag accumulated in the main LOFIC 252 is compensated for based on the image lag accumulated in the subordinate LOFIC 254-$n$ that was inactive during the integration period of that frame. Each of subordinate LOFICs 254-$n$ may undergo the same operation as the main LOFIC 252 in the idle, precharge (such as zero- or reverse-biasing), and readout periods of any frame to closely monitor the lag behavior of the main LOFIC 252. One example method that compensates for the image lag accumulated in the main LOFIC 252 is illustrated below in FIG. 6.

In the example, each of the main LOFIC 252 and the subordinate LOFICs 254-$n$ is implemented with a metal-insulator-metal (MIM) capacitor including a high dielectric or high-k insulating material disposed between a first metal electrode and a second metal electrode. In various examples, the insulating material disposed between the first metal electrode and the second metal electrode of the main LOFIC 252 and subordinate LOFICs 254-$n$ may be formed of a single layer of high-k material or a multiple layer stack of high-k material. The exact composition and an overall thickness of high-k material may depend on the desired LOFIC capacitance. In the various examples, high-k material may include one of aluminum oxide ($AhO_3$), Zirconium dioxide ($ZrO_2$), Hafnium oxide (HfO), or a combination thereof. In various examples, the main LOFIC 252 and the subordinate LOFICs 254-$n$ have substantially the same dimensions, dielectric composition, dielectric thickness, and/or biasing scheme (e.g., to have similar operation conditions). In various examples, the main LOFIC 252 has a different (e.g., larger) capacitance area than each of the subordinate LOFICs 254-*n*. Using a smaller capacitance area for each of the subordinate LOFICs 254-*n* allows the subordinate LOFICs 254-*n* to occupy less space, which allows the use of a smaller wafer.

In operation, the bias voltage source VCAP 238 is configured to provide a bias voltage to the LOFIC network 250 during precharge and readout periods. In one example, the bias voltage source VCAP 238 may have a value between 0V and 3.5V. It is appreciated that in the various examples, the voltage level of the bias voltage source VCAP 238 may be determined in consideration of the stable range of the high-k material. In the example, during the idle period, the reset control signal RST 240 may have a value sufficient to turn on the reset transistor 232 (e.g., between 2.5V and 4V), the dual floating diffusion control signal DFD 244 may have a high voltage value ranging between 2.5 V and 4V, the LOFIC transistor control signal LOF 242 may have a value of 0V to 4V, and the transfer control signal TX 246 may have a value of 0V to 3V.

Figure 3A:
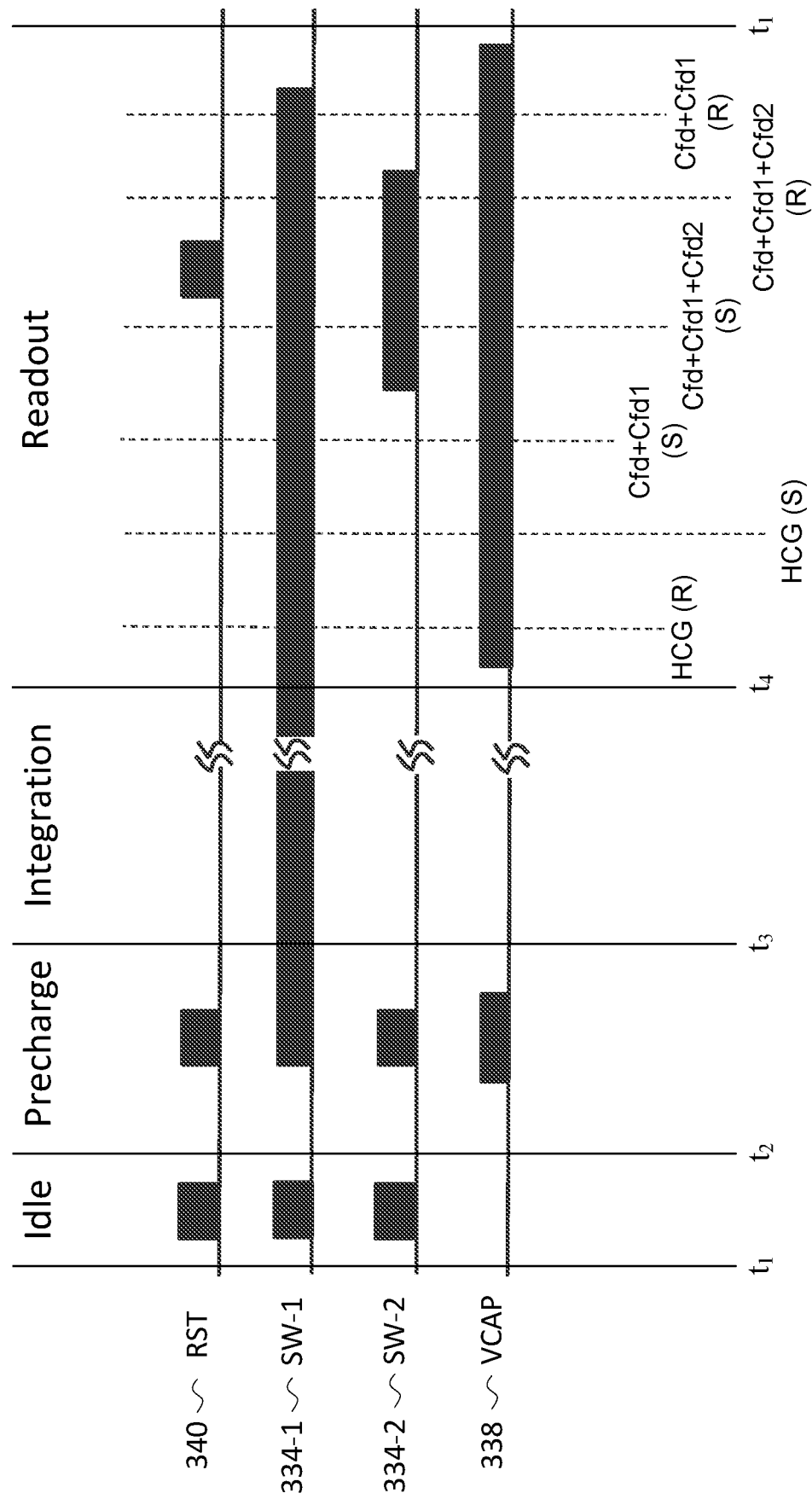
FIGS. 3A and 3B illustrate timing diagrams of different frame periods of example signal values in an example pixel circuit including a LOFIC network and a photodiode during idle, precharge, integration, and readout periods in accordance with the teachings of the present disclosure.
Figure 3B:
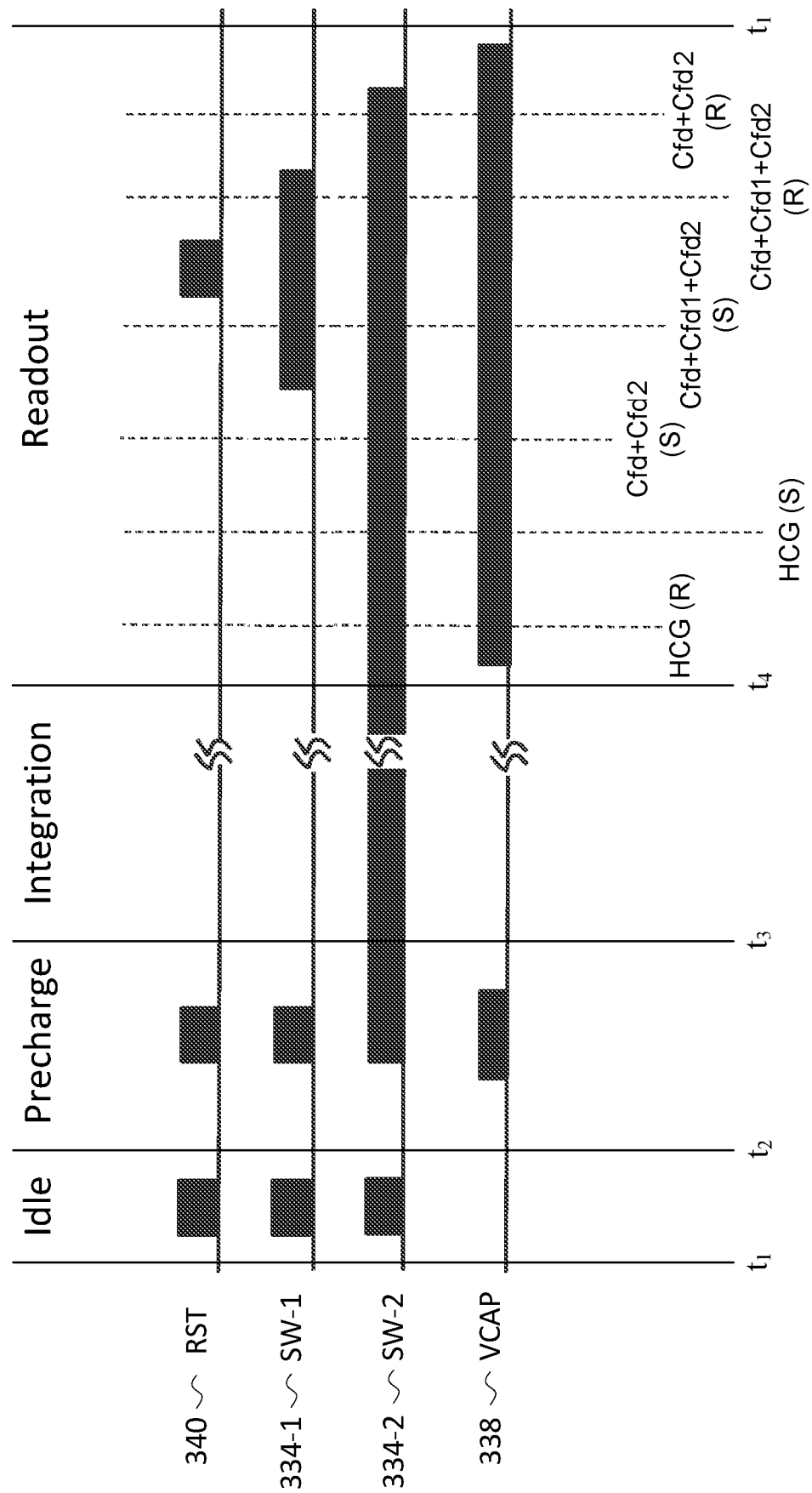

FIGS. 3A and 3B illustrate timing diagrams of a first frame period and a second frame period, respectively, of example signal values in an example pixel circuit including a LOFIC network and a photodiode. Each frame (i.e., each of FIGS. 3A and 3B) operates in idle, precharge, integration, and readout periods in accordance with the teachings of the present disclosure. It is appreciated that the signals depicted in FIGS. 3A and 3B may be examples of the signals depicted in FIG. 2 for controlling the operation of the example pixel circuit such as pixel circuit 204, and that similarly named and numbered elements described above are coupled and function similarly below.

Referring now to the depicted examples, FIGS. 3A and 3B illustrate a reset control signal RST 340, a first switch control signal SW-1 334-1, a second switch control signal SW-2 334-2, and a bias voltage source VCAP 338, which are configured to control the respective circuit elements discussed in detail above in FIG. 2.

At time $t_1$, the idle period of the frame period begins. As depicted in FIGS. 3A and 3B, the reset control signal RST 340 pulses the reset transistor 232, the first switch control signal SW-1 334-1 pulses the first switch transistor 256-1, and the second switch control signal SW-2 334-2 pulses the second switch transistor 256-2 such that each of the subordinate LOFICs 254-*n* and the main LOFIC 252 receive the same bias operation (e.g., having the same bias voltage across each of the subordinate LOFICs 254-*n* and the main LOFIC 252). The bias voltage source VCAP 338 may be configured to have low a value (e.g., 0 volts) during the idle period. In various examples, the LOFIC network 250 shortens the idle period because residual charges in the subordinate LOFICs 254-*n* can be discharged during one or more entire frame periods instead of just the idle period.

At time $t_2$, the idle period ends and the precharge period begins. The reset control signal RST 340 pulses the reset transistor 232 and the bias voltage source 338 is pulsed. For each frame, one of the switch control signals SW-1 334-1 or SW-2 334-2 turns on the corresponding switch transistor 256-1 or 256-2 (e.g., in FIG. 3A, the first switch control signal SW-1 334-1 is turned on) until the end of the readout period, while the other switch control signal SW-2 334-2 or SW-1 334-1 is pulsed during the precharge period (e.g., in FIG. 3A, the second switch control signal SW-2 334-2 is pulsed). Each of each of the subordinate LOFICs 254-*n* and the main LOFIC 252 are precharged at the same time. In various examples, each of the subordinate LOFICs 254-*n* and the main LOFIC 252 may be reversed-biased during the precharge period to remove at least a portion of residue charges accumulated in the previous frame(s).

At time $t_3$, the precharge period ends and the integration period begins. The switch control signal SW-n 334-*n* corresponding to the frame remains (e.g., first switch control signal SW-1 334-1 in FIG. 3A, second switch control signal SW-2 334-2 in FIG. 3B) on until the end of the readout period as aforementioned. The other control signals (e.g., second switch control signal SW-2 334-2 in FIG. 3A, first switch control signal SW-1 334-1 in FIG. 3B) are turned off. As such, both the main LOFIC 252 and the respective active subordinate LOFIC (e.g., subordinate LOFIC 254-1 for FIG. 3A, subordinate LOFIC 254-2 for FIG. 3B) are exposed at the same time. During integration, the photodiode 214 photogenerates image charge in response to incident light. The pixel circuit 204 is configured such that excess photogenerated charges may overflow from the photodiode 214 to the LOFIC network 250 into the main LOFIC 252 and/or the active subordinate LOFIC (e.g., subordinate LOFIC 254-1 for FIG. 3A, subordinate LOFIC 254-2 for FIG. 3B) through the dual floating diffusion transistor 224 and the LOFIC transistor 228 for storage under strong or bright light conditions (e.g., LED light or IR light).

In one example, during the integration period, excess image charge photogenerated is configured to overflow from the photodiode 214 to the second floating diffusion FD2 226 through the dual floating diffusion transistor 224 and to the LOFIC network 250 (e.g., overflow to and stored in the main LOFIC 252 and/or the active subordinate LOFIC 254-*n*) through the dual floating diffusion transistor 224 and the LOFIC transistor 228.

At time $t_4$, the integration period ends and the readout period begins. The bias voltage source VCAP 338 is turned on and remains on until the end of the readout period. Next, a correlated double sampling (CDS) readout of the photodiode 214 occurs during which time a high conversion gain (HCG) readout of a reset value (R) from the photodiode 214 and the first floating diffusion FD1 218 occurs. Then, a HCG readout of a signal value (S) occurs.

Next, a LOFIC readout of the photodiode 214 occurs during which time a first signal readout of a signal value (S) occurs (e.g., Cfd+Cfd1 (S) in FIG. 3A, Cfd+Cfd2 (S) in FIG. 3B), where Cfd is the signal corresponding to charge stored in the main LOFIC 252, Cfd1 is the signal corresponding to charges stored in subordinate LOFIC 254-1, and Cfd2 is the signal corresponding to charges stored in subordinate LOFIC 254-2. The first signal is output by the pixel circuit 204 in response to image charge from the main LOFIC 252 and the subordinate LOFIC 254-*n* that remained on or active by the corresponding switch transistor 256-*n* and the switch control signal during the integration period (e.g., the first switch control signal SW-1 334-1 for FIG. 3A and the second switch control signal SW-2 334-2 for FIG. 3B) of that frame. Next, the switch transistor that was off during the integration period is turned on by the corresponding switch control signal (e.g., the second switch control signal SW-2 334-2 for FIG. 3A and the first switch control signal SW-1 334-1 for FIG. 3B). Then, a second signal readout of a signal value (S) occurs (e.g., Cfd+Cfd1+Cfd2 (S) in FIG. 3A and FIG. 3B). The second signal is output by the pixel circuit 204 in response to image charge from the main LOFIC 252 and both first and second subordinate LOFICs 254-1 and 254-2 included in the LOFIC network 250.

Next, the reset control signal RST 340 pulses the reset transistor 232 and a second signal readout of a reset value (R) occurs (e.g., Cfd+Cfd1+Cfd2 (R) in FIGS. 3A and 3B). Then, the switch control signal that was turned on between the first and second signal readouts of signal (S) values (e.g., the second switch control signal SW-2 334-2 for FIG. 3A and the first switch control signal SW-1 334-1 for FIG. 3B) turns the corresponding switch transistor 256-n back off. Then, a first signal readout of a reset value (R) occurs (e.g., Cfd+Cfd1 (R) in FIG. 3A, Cfd+Cfd2 (R) in FIG. 3B). In the various examples, a CDS HCG readout may be determined by finding the difference between the HCG signal value (S) and the HCG reset value (R), and a CDS LOFIC readout of the first or second signals may be determined by finding the difference between the LOFIC signal value (S) and the corresponding LOFIC reset value (R). In various examples, an additional CDS readout of the photodiode 214 for a medium conversion gain (MCG) readout such as a reset value (R) and a signal value (S) readout from the photodiode 214, the first floating diffusion FD1 218 and the second floating diffusion FD 226 may occur before the CDS LOFIC readout.

Next, the switch control signal that was on during the integration period (e.g., the first switch control signal SW-1 334-1 for FIG. 3A and the second switch control signal SW-2 334-2 for FIG. 3B) turns off the corresponding switch transistor 256-n and the bias voltage source VCAP 338 is turned off. The timing diagram moves onto time $t_1$ for the next frame.

In the examples illustrated in FIGS. 2, 3A, and 3B, the LOFIC network 250 includes two subordinate capacitor-switch pairs. Therefore, the two switch transistors of the LOFIC network 250 can alternate being turned on during the integration period on a frame-by-frame basis (e.g., the first switch control signal SW-1 334-1 is on during the integration period of odd-numbered frames, and the second switch control signal SW-2 334-2 is on during the integration period of even-numbered frames). As will be described below, in other examples, the LOFIC network 250 can have more than two subordinate capacitor-switch pairs.

Figure 4:
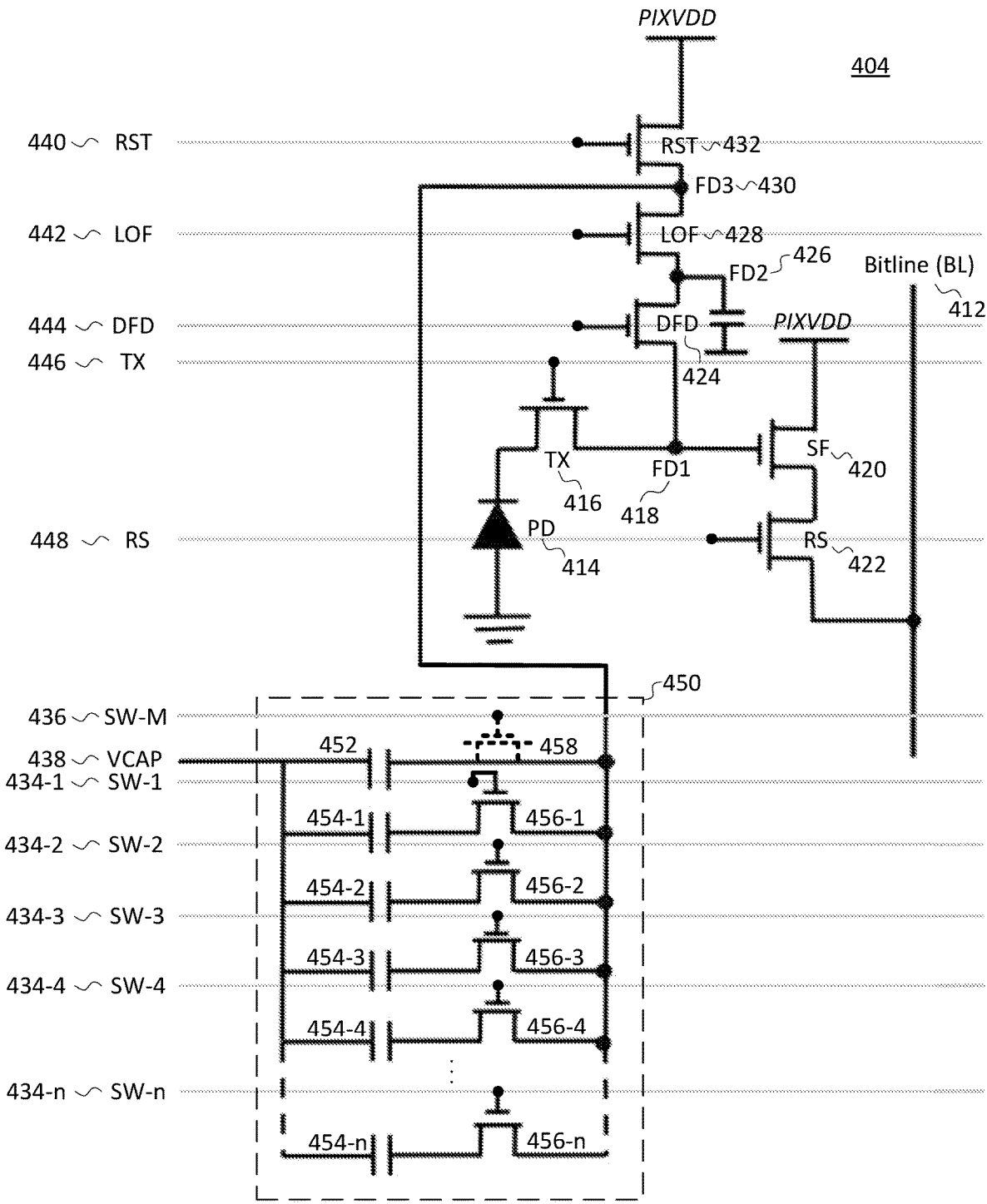
FIG. 4 illustrates a schematic of one example of a pixel circuit including a lateral overflow integration capacitor (LOFIC) network and a photodiode in accordance with the teachings of the present disclosure.

FIG. 4 illustrates a schematic of one example of a pixel circuit 404 including a LOFIC network 450 and a photodiode 414 in accordance with the teachings of the present disclosure. It is appreciated that the pixel circuit 404 of FIG. 4 may be an example of one of the pixel circuits 104 included in pixel array 102 as shown in FIG. 1, and that similarly named and numbered elements described above are coupled and function similarly below.

As shown in the depicted example, pixel circuit 404 includes a photodiode 414, which is configured to photo-generate image charge in response to incident light. In the depicted example, pixel circuit 404 also includes a first floating diffusion FD1 418 coupled to receive the image charge from the photodiode 414 through a transfer transistor 416. In the example, the transfer transistor 416 is coupled to be controlled in response to a transfer control signal TX 446 to transfer image charge from the photodiode 414 to the first floating diffusion FD1 418, for example, during a readout period associated with the pixel circuit 404. A source follower transistor 420 has a gate coupled to the first floating diffusion FD1 418, and a row select transistor 422 is coupled to the source follower transistor 420 such that the source follower transistor 420 and the row select transistor 422 are coupled between a power line PIXVDD and a bitline 412 to output an image signal from the pixel circuit 404 in response to a row select control signal RS 448 and the amount of charge at the gate of the source follower transistor 420.

In the example illustrated in FIG. 4, a dual floating diffusion transistor 424 is coupled between the first floating diffusion FD1 418 and a second floating diffusion FD2 426. The second floating diffusion FD2 426 is coupled to a capacitor configured to receive excess image charge overflow from photodiode 414 through transfer transistor 416 and the dual floating diffusion transistor 424. The second floating diffusion FD2 426 is further coupled to a source of a LOFIC transistor 428. A third floating diffusion FD3 430 is coupled between the LOFIC transistor 428 and the reset transistor 432. A drain of reset transistor 432 is coupled to reset voltage source PIXVDD and a source of the reset transistor 432 is coupled to the third floating diffusion FD3 430. The dual floating diffusion transistor 424 is coupled to be controlled in response to a dual floating diffusion control signal DFD 444, the LOFIC transistor 428 is coupled to be controlled in response to a LOFIC transistor control signal LOF 442, and the reset transistor 432 is coupled to be controlled in response to a reset control signal RST 440.

As shown in the depicted example, pixel circuit 404 also includes a LOFIC network 450 coupled between a bias voltage source VCAP 438 and the third floating diffusion FD3 430. Therefore, it is appreciated that the LOFIC network 250 is selectively coupled to the first floating diffusion FD1 418 through the LOFIC transistor 428 and the dual floating diffusion transistor 424. The LOFIC network 450 is configured to receive excess image charge overflow from the photodiode 414 (e.g., under a bright light condition, such as IR or LED light).

In the example, the LOFIC network 450 includes a main LOFIC 452 and a plurality of subordinate capacitor-switch pairs coupled in parallel. Each subordinate capacitor-switch pair includes a respective subordinate LOFIC 454-1, 454-2, 454-3, 454-4 . . . 454-n and a switch transistor 456-1, 456-2, 456-3, 456-4 . . . 456-n. The switch transistors are coupled to be controlled in response to switch control signals SW-1 434-1 . . . SW-n 434-n. As will be discussed in the various examples, the subordinate LOFICs 454-1 . . . 454-n in the LOFIC network 450 that are inactive during the integration period of a frame are given enough time to relax and sufficiently discharge residual charges such that the remaining charge will not have an impact on a next captured frame during operation by sequentially coupling and decoupling the subordinate LOFICs 454-1 . . . 454-n from the rest of the pixel circuit on a frame-by-frame basis via the switch transistors 456-1 . . . 456-n. For example, during the integration period in each frame period of the image sensor, only one switch transistor (e.g., 456-1) of the subordinate capacitor-switch pairs of the LOFIC network 450 is on. The remaining switch transistors (e.g., 456-2 . . . 456-n) are simultaneously turned off. As the image sensor moves on to the next frame, the next switch transistor (e.g., 456-2) is turned on during the integration period and the other switch transistors, including the switch transistor that was on during the previous frame (e.g., 456-1, 456-3 . . . 456-n), are simultaneously turned off. In various examples, for the (n+1)-th frame period, the pixel circuit 404 cycles back to turning the first switch transistor 456-1 on. The subordinate LOFICs 454-1 . . . 454-n coupled to the switch transistors 456-1 . . . 456-n that are off during the integration period can discharge residual charges prior to the frame in which its corresponding switch transistor would be turned on. Accordingly, a subordinate LOFIC 454-1 . . . 454-n storing charges from its active frame period has plenty of idle period to fully relax and sufficiently discharge before the integration period in its next active frame, reducing any undesirable image lag (e.g., visible artifacts on the captured frame).

In the various examples, the number of subordinate capacitor-switch pairs may depend on the frame rate desired and how much time a subordinate LOFIC needs to sufficiently discharge (e.g., more than 10 ms, more than 100 ms).

For example, if a subordinate LOFIC takes 30 ms to sufficiently discharge and a frame rate of 30 frames per second (fps) is desired (each frame lasts about 33 ms), the LOFIC network should have at least two subordinate capacitor-switch pairs. The number of subordinate capacitor-switch pairs may also depend on the target level of lag compensation. For example, two subordinate capacitor-switch pairs may compensate lag charges accumulated in one previous frame. For example, three subordinate capacitor-switch pairs may compensate lag charges accumulated in two previous frames (e.g., charges accumulated in frame N−1 and frame N−2). Having N subordinate capacitor-switch pairs enables lag correction or compensation of up to N−1 frames. However, having more subordinate capacitor-switch pairs can increase the reduction in image lag but should be balanced against the greater size of a semiconductor substrate necessary to accommodate all elements of the pixel circuit 404. It is noted that residual charges accumulated in response to a bright frame would mostly be released or discharged in the subsequent two frames, so having two subordinate capacitor-switch pairs may be sufficient for compensating image lag.

In various examples, the LOFIC network 450 may also include a main switch transistor 458 to which the main LOFIC 452 is coupled, selectively coupling the main LOFIC 452 to the third floating diffusion FD3 426 and controlling an overflow path between photodiode 414 and the main LOFIC 452. In the depicted example, the main switch transistor 458 is coupled to be controlled in response to a main switch control signal SW-M 436. In various examples, the main switch transistor 458 can be configured to remain on during all frame periods.

In various examples, the main switch transistor is not included and the main LOFIC 452 is therefore active during every frame and does not have enough time to fully relax and sufficiently discharge before the next frame. Instead of discharging the residual image charges on the main LOFIC 452, image lag accumulated in the main LOFIC 452 is compensated for based on the image lag accumulated in the subordinate LOFICs 454-$n$ that were inactive during the integration period of that frame. One example method that compensates for the image lag accumulated in the main LOFIC 452 is illustrated below in FIG. 6.

In the example, each of the main LOFIC 452 and the subordinate LOFICs 454-$n$ is implemented with a metal-insulator-metal (MIM) capacitor including a high dielectric or high-k insulating material disposed between a first metal electrode and a second metal electrode. In various examples, the insulating material disposed between the first metal electrode and the second metal electrode of the main LOFIC 452 and subordinate LOFICs 454-$n$ may be formed of a single layer of high-k material or a multiple layer stack of high-k material. The exact composition and an overall thickness of high-k material may depend on the desired LOFIC capacitance. In the various examples, high-k material may include one of aluminum oxide ($AhO_3$), Zirconium dioxide ($ZrO_2$), Hafnium oxide (HfO), or a combination thereof. The main LOFIC 452 and the subordinate LOFICs 454-$n$ may have substantially the same dimensions, dielectric composition, dielectric thickness, and/or biasing scheme (e.g., to have similar operation conditions). In various examples, the main LOFIC 452 has a different (e.g., larger) capacitance area than each of the subordinate LOFICs 454-$n$. Using smaller capacitor area for the subordinate LOFICs 454-$n$ allows the use of a smaller wafer.

In operation, the bias voltage source VCAP 438 is configured to provide a bias voltage to the LOFIC network 450 during precharge and readout periods. In one example, the bias voltage source VCAP 438 may have a value between 0V and 3.5V. It is appreciated that in the various examples, the voltage level of the bias voltage source VCAP 438 may be determined in consideration of the stable range of the high-k material. In the example, during the idle period, the reset control signal RST 440 may have a value sufficient to turn on the reset transistor 432 (e.g., between 4.5V and 4V), the dual floating diffusion control signal DFD 444 may have a high voltage value ranging between 2.5 V and 4V, the LOFIC transistor control signal LOF 442 may have a value of 0V to 4V, and the transfer control signal TX 446 may have a value of 0V to 3V.

Figure 5A:
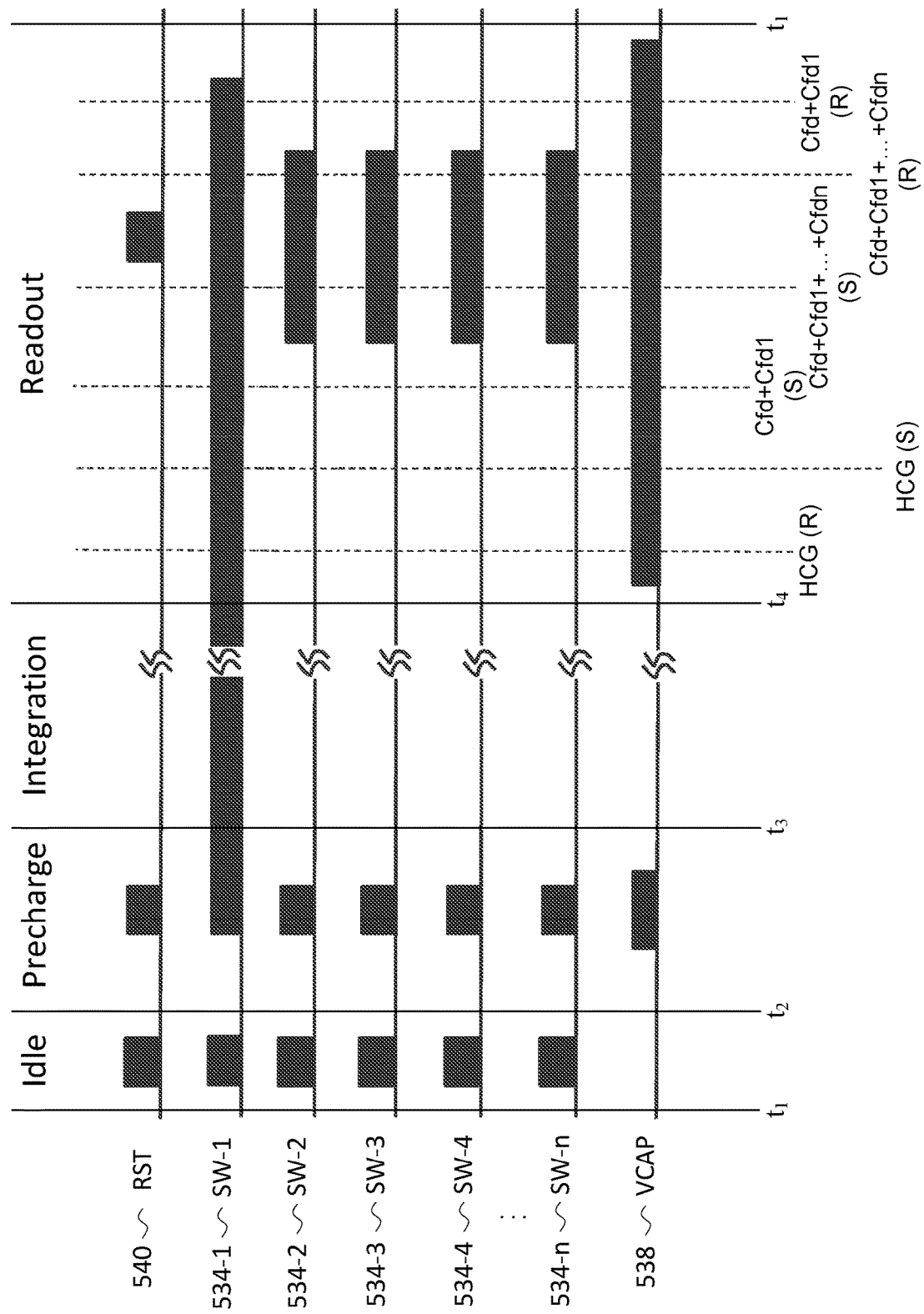
FIGS. 5A, 5B, and 5C illustrate timing diagrams of different frame periods of example signal values in an example pixel circuit including a LOFIC network and a photodiode during idle, precharge, integration, and readout periods in accordance with the teachings of the present disclosure.
Figure 5B:
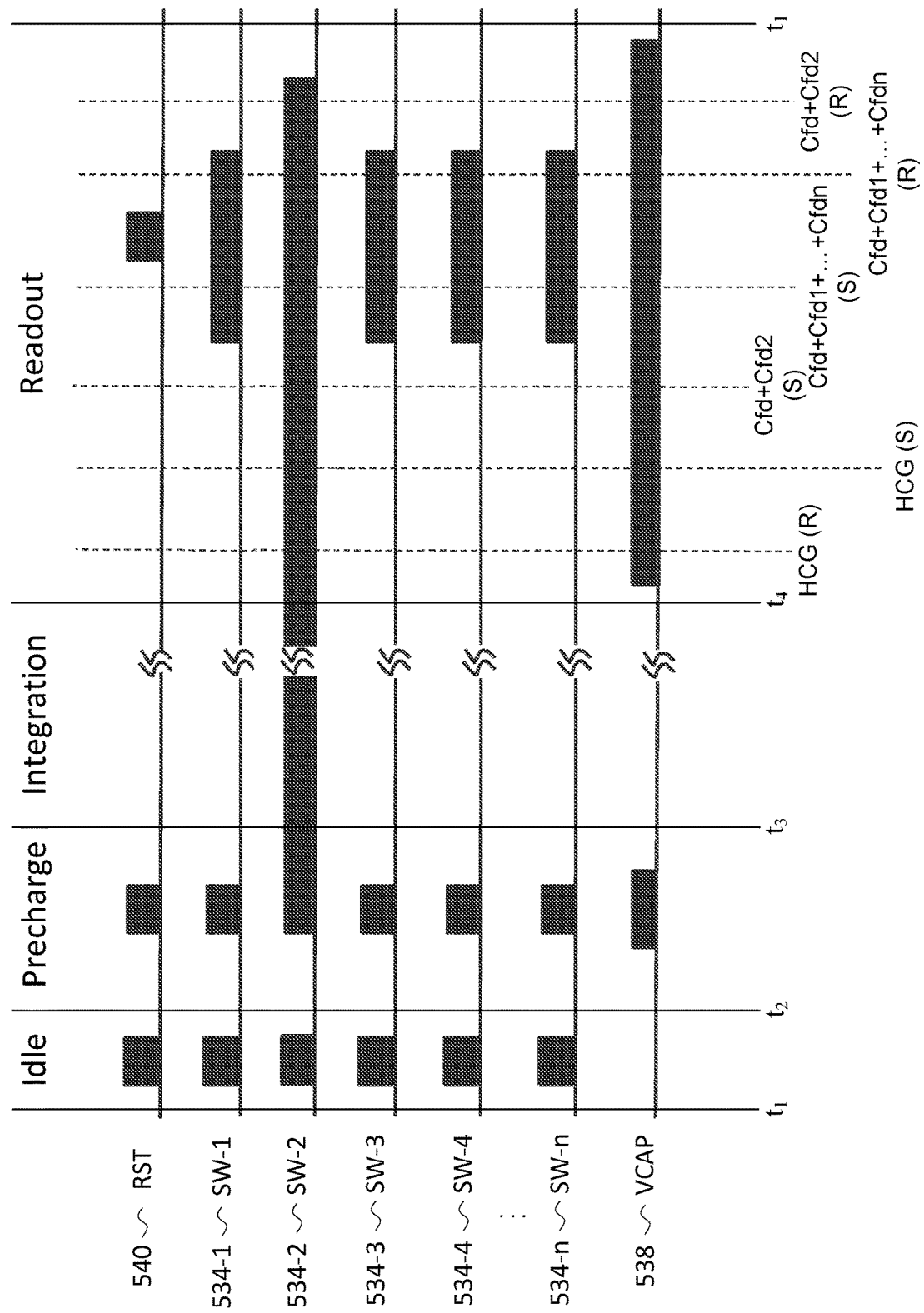
Figure 5C:
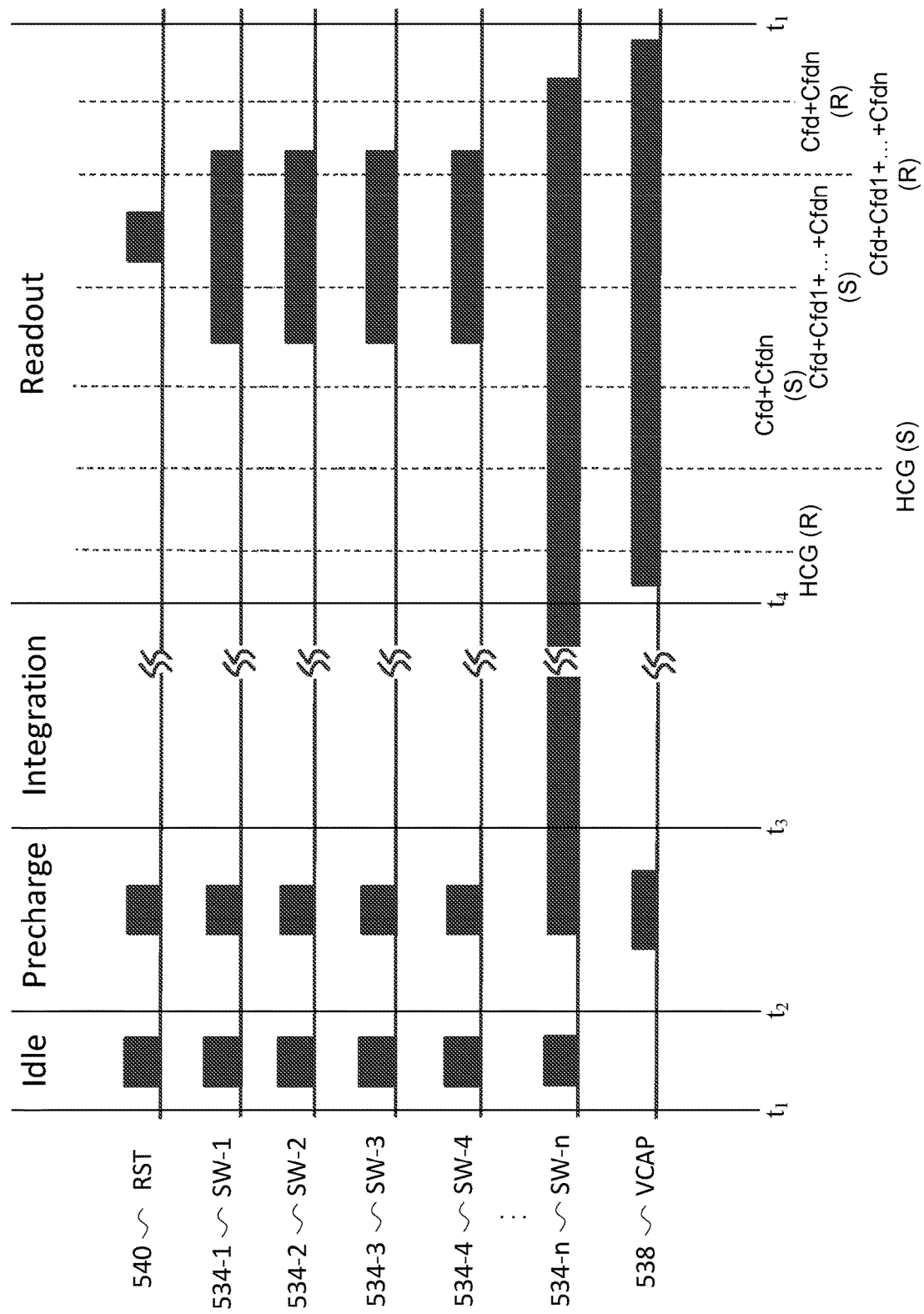

FIGS. 5A, 5B, and 5C illustrate timing diagrams of a first frame period, a second frame period, and an n-th frame period, respectively, of example signal values in an example pixel circuit including a LOFIC network and a photodiode. Each frame (i.e., each of FIGS. 5A, 5B, and 5C) operates in idle, precharge, integration, and readout periods in accordance with the teachings of the present disclosure. It is appreciated that the signals depicted in FIGS. 5A, 5B, and 5C may be examples of the signals depicted in FIG. 4 for controlling the operation of the example pixel circuit such as pixel circuit 404, and that similarly named and numbered elements described above are coupled and function similarly below.

Referring now to the depicted examples, FIGS. 5A, 5B, and 5C illustrate a reset control signal RST 540, a first switch control signal SW-1 534-1, a second switch control signal SW-2 534-2, a third switch control signal SW-3 534-3, a fourth switch control signal SW-4 534-4, an n-th switch control signal SW-n 534-$n$, and a bias voltage source VCAP 538, which are configured to control the respective circuit elements discussed in detail above in FIG. 4.

At time $t_1$, the idle period of the frame period begins. As depicted in FIGS. 5A, 5B, and 5C, the reset control signal RST 540 pulses the reset transistor 432 and all switch control signals SW-1 534-1 . . . SW-n 534-$n$ pulse their corresponding switch transistors 456-1 . . . 456-$n$. The bias voltage source VCAP 538 is configured to have low a value (e.g., 0 volts) during the idle period. In various examples, the LOFIC network 450 shortens the idle period because residual charges in the subordinate LOFICs 454-$n$ can be discharged during one or more entire frame periods instead of just the idle period.

At time $t_2$, the idle period ends and the precharge period begins to reset the photodiode 414, the first, second, and third floating diffusions FD1 418, FD2 426, FD3 430, and the LOFIC network 450. The reset control signal RST 540 pulses the reset transistor 432 and the bias voltage source 538 is pulsed. For each frame, one of the switch control signals SW-1 534-1 . . . SW-n 534-$n$ turns on the corresponding switch transistor 456-1 . . . 456-$n$ (e.g., in FIG. 5C, the n-th switch control signal SW-n 534-$n$ is turned on) until the end of the readout period, while the other switch control signals SW-1 534-1 . . . SW-n 534-$n$ are pulsed during the precharge period (e.g., in FIG. 5C, each of the first through (n−1)-th switch control signals SW-1 534-1 . . . SW-(n−1) 534-(n−1) is pulsed) such that all subordinate LOFICs 454-$n$ and the main LOFIC 452 receive the same bias operation.

At time $t_3$, the precharge period ends and the integration period begins. The switch control signal SW-n 534-$n$ corresponding to the active subordinate LOFIC 454-$n$ for the frame remains on until the end of the readout period as aforementioned. The other control signals are turned off such to ensure that other subordinate LOFICs 454-$n$ are inactive. During integration, the photodiode 414 photogenerates image charge in response to incident light. The pixel circuit 404 is configured such that excess photogenerated charges may overflow from the photodiode 414 to the LOFIC network 450 through the dual floating diffusion transistor 424 and the LOFIC transistor 428 for storage under strong or bright light conditions (e.g., LED light or IR light).

In one example, during the integration period, excess image charge photogenerated is configured to overflow from the photodiode 414 to the second floating diffusion FD2 426 through the dual floating diffusion transistor 424 and to the LOFIC network 450 through the dual floating diffusion transistor 424 and the LOFIC transistor 428.

At time $t_4$, the integration period ends and the readout period begins. The bias voltage source VCAP 538 is turned on and remains on until the end of the readout period. Next, a correlated double sampling (CDS) readout of the photodiode 414 occurs during which time a high conversion gain (HCG) readout of a reset value (R) from the photodiode 414 occurs. Then, a HCG readout of a signal value (S) occurs.

Next, a LOFIC readout of the photodiode 414 occurs during which time a first signal readout of a signal value (S) occurs. The first signal is output by the pixel circuit 404 in response to image charge from the main LOFIC 452 and the subordinate LOFIC 454-$n$ that remained on by the corresponding switch transistor 456-$n$ and the switch control signal during the integration period (e.g., the n-th switch control signal SW-n 534-$n$ for FIG. 5C). Next, the switch transistors 456-$n$ that were off are turned on by the corresponding switch control signals (e.g., the first through (n–1)-th switch control signals SW-1 534-1 . . . SW-(n–1) 534-(n–1) for FIG. 5C). Then, a second signal readout of a signal value (S) occurs. The second signal is output by the pixel circuit 404 in response to image charge from the main LOFIC 452 and all subordinate LOFICs 454-1 . . . 454-$n$ included in the LOFIC network 450.

Next, the reset control signal RST 540 pulses the reset transistor 432 and a second signal readout of a reset value (R) occurs. Then, the switch control signals that were turned on between the first and second signal readouts of signal (S) values (e.g., the first through (n–1)-th switch control signals SW-1 534-1 . . . SW-(n–1) 534-(n–1) for FIG. 5C) turn the corresponding switch transistors 456-$n$ back off. Then, a first signal readout of a reset value (R) occurs. In the various examples, a CDS HCG readout may be determined by finding the difference between the HCG signal value (S) and the HCG reset value (R), and a CDS LOFIC readout of the first or second signals may be determined by finding the difference between the LOFIC signal value (S) and the corresponding LOFIC reset value (R).

Next, the switch control signal that was on during the integration period (e.g., the n-th switch control signal SW-n 534-$n$ for FIG. 5C) turns off the corresponding switch transistor 456-$n$ and the bias voltage source VCAP 538 is turned off. The timing diagram moves onto time $t_1$ for the next frame.

In the examples illustrated in FIGS. 4, 5A, 5B, and 5C, the LOFIC network 450 includes n subordinate capacitor-switch pairs. Therefore, the n switch transistors of the LOFIC network 450 can alternate being turned on (or be turned on one at a time) during the integration period on a frame-by-frame basis (e.g., the first switch control signal SW-1 534-1 is on during the integration period of the first, (n+1), (2n+1), etc. frames, and the second switch control signal SW-2 534-2 is on during the integration period of the second, (n+2), (2n+2), etc. frames).

Figure 6:
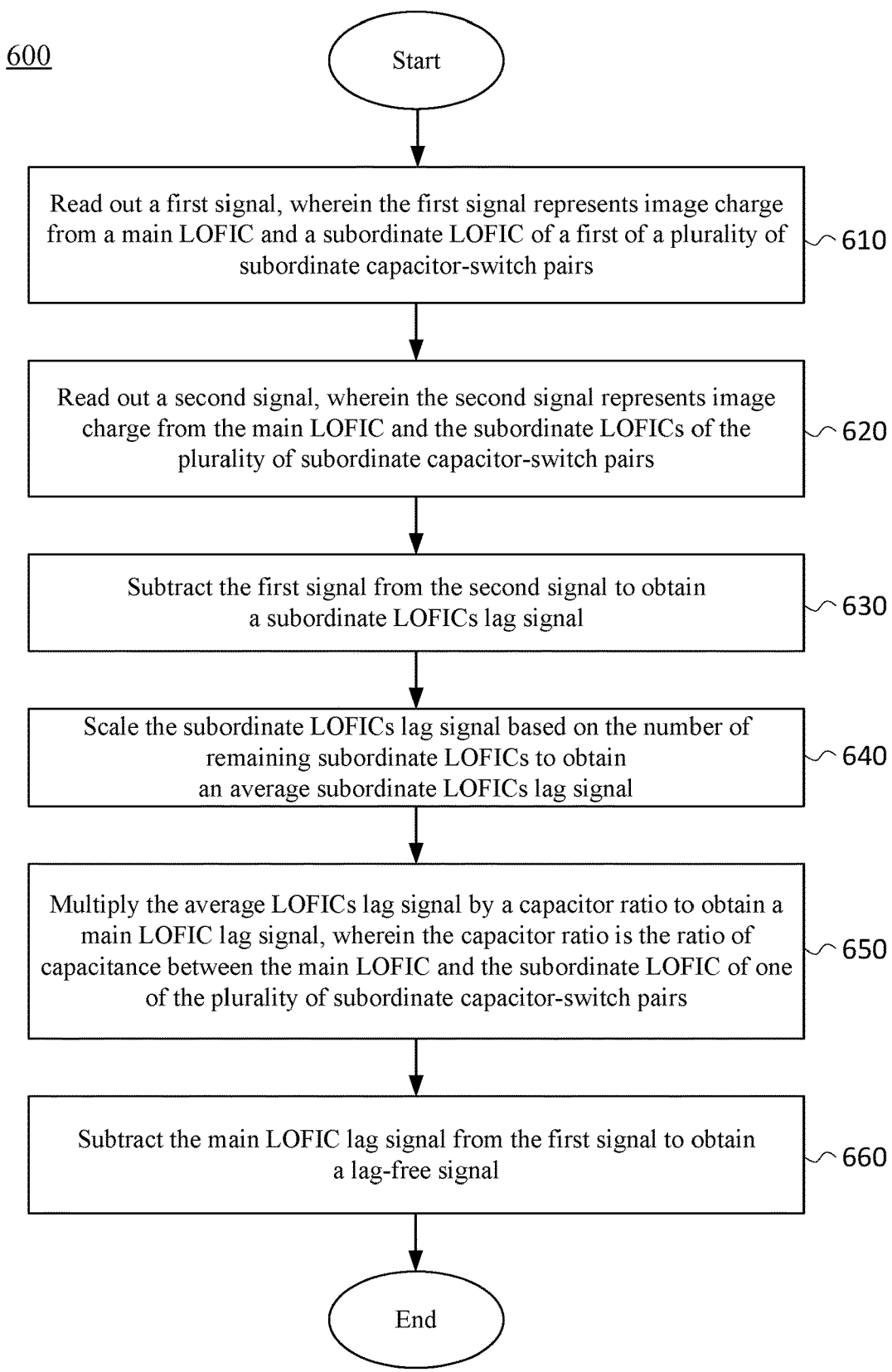
FIG. 6 is a flow diagram that illustrates a method of operating one example of a pixel circuit including a lateral overflow integration capacitor (LOFIC) network and a photodiode in accordance with the teachings of the present disclosure.

FIG. 6 is a flow diagram that illustrates a process 600 for operating one example of a pixel circuit including a lateral overflow integration capacitor (LOFIC) network and a photodiode in accordance with the teachings of the present disclosure. It is appreciated that the processing depicted in FIG. 6 may be used in the operation of the example pixel circuits depicted in FIGS. 2 and 4, such as pixel circuits 204 and 404. In various examples, the process 600 is used to compensate for the image lag accumulated in a main LOFIC.

At processing block 610, a first signal is read out (e.g., by readout circuit 106 illustrated in FIG. 1) in response to image charge from a main LOFIC (e.g., main LOFIC 452) and a subordinate LOFIC of a first of a plurality of subordinate capacitor-switch pairs (e.g., first subordinate capacitor 454-1). Because the first subordinate LOFIC is presumed to have discharged all residual image charges and to output no image lag, the first signal represents the lag-free signal for that frame plus the image lag from the main LOFIC. In various examples, a correlated double sampling (CDS) LOFIC readout of the first signal may be determined by finding the difference between the LOFIC signal value (S) and the LOFIC reset value (R) that correspond to the first signal, as discussed above with reference to FIGS. 3A, 3B, 5A, 5B, and 5C.

At processing block 620, a second signal is read out in response to image charge from the main LOFIC and all subordinate LOFICs of the plurality of subordinate capacitor-switch pairs (e.g., subordinate capacitors 454-1 . . . 454-$n$). The second signal represents the lag-free signal for that frame plus the image lag from the main LOFIC (i.e., the first signal) plus the image lag from the subordinate LOFICs (as aforementioned, the first subordinate LOFIC is presumed to have discharged all residual image charges and to output no image lag). In various examples, a CDS LOFIC readout of the second signal may be determined by finding the difference between the LOFIC signal value (S) and the LOFIC reset value (R) corresponding to the second signal, as discussed above with reference to FIGS. 3A, 3B, 5A, 5B, and 5C.

At processing block 630, a difference between the first and second signals is determined (e.g., subtract the first signal from the second signal) to obtain a subordinate LOFICs lag signal. The subordinate LOFICs lag signal represents the image lag from all subordinate LOFICs (as aforementioned, the first subordinate LOFIC is presumed to have zero image lag).

At processing block 640, the subordinate LOFICs lag signal is scaled based on the number of remaining subordinate LOFICs (number of subordinate LOFICs with image lag, i.e., n–1) to obtain an average subordinate LOFICs lag signal. At any given frame, each subordinate LOFIC has been discharging residual image charges for different periods of time (e.g., in a pixel circuit with five subordinate capacitor-switch pairs, at the beginning of the 5th frame, the first subordinate LOFIC had three full frame periods to discharge while the third subordinate LOFIC only had one full frame period to discharge). Therefore, each subordinate LOFIC may contain varying levels of image lag. In one example, the average subordinate LOFICs lag signal is obtained by finding a quotient of the subordinate LOFICs lag signal and the number of remaining subordinate LOFICs (i.e., n–1) (e.g., division).

At processing block 650, a product of the average LOFICs lag signal and a capacitor ratio is determined (e.g., multiplication) to obtain a main LOFIC lag signal. The main LOFIC lag signal represents the image lag from the main LOFIC. The capacitor ratio is the ratio of capacitance between the main LOFIC and one of the subordinate LOFICs. In various examples, image lag accumulated in a capacitor is presumed to be proportional to the capacitance of the capacitor. Therefore, the image lag ratio between the main LOFIC and a subordinate LOFIC is presumed to be equivalent to the capacitance ratio between the main LOFIC and the subordinate LOFIC. Furthermore, the capacitance of a capacitor is proportional to the dielectric constant, proportional to the capacitance area, and inversely proportional to the dielectric thickness. Therefore, if the main LOFIC and the subordinate LOFICs have the same dielectric composition and dielectric thickness, the capacitance ratio can be replaced by the capacitance area ratio. As a result, in various examples, the main LOFIC lag signal is obtained by multiplying the average LOFICs lag signal by the capacitance area ratio.

At processing block 660, a difference between the main LOFIC lag signal and the first signal is determined (e.g., subtraction) to obtain the lag-free signal of the frame. As aforementioned, the first signal represents the lag-free signal for that frame plus the image lag from the main LOFIC.

The various embodiments of the LOFIC network described herein can be used with any imaging system that includes MIM capacitors (e.g., auto sensors). The LOFIC network disclosed helps solve lag issues associated with imaging systems.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A pixel circuit, comprising:
    a photodiode configured to photogenerate image charge in response to incident light;
    a floating diffusion coupled to receive the image charge from the photodiode;
    a transfer transistor coupled between the photodiode and the floating diffusion, wherein the transfer transistor is configured to transfer the image charge from the photodiode to the floating diffusion;
    a reset transistor coupled between a reset voltage and the floating diffusion; and
    a lateral overflow integration capacitor (LOFIC) network coupled between the reset transistor and a bias voltage source, wherein the LOFIC network comprises:
        a main LOFIC coupled between the reset transistor and the bias voltage source; and
        a plurality of subordinate capacitor-switch pairs, wherein each of the plurality of subordinate capacitor-switch pairs comprises:
            a subordinate LOFIC; and
            a switch transistor coupled to the subordinate LOFIC, wherein each of the plurality of subordinate capacitor-switch pairs is coupled between the reset transistor and the bias voltage source.

2. The pixel circuit of claim 1, wherein the pixel circuit is configured to:
    output a first signal in response to image charge from the main LOFIC and the subordinate LOFIC of a first of the plurality of subordinate capacitor-switch pairs; and
    output a second signal in response to image charge from the main LOFIC and all the subordinate LOFICs of the plurality of subordinate capacitor-switch pairs,
    wherein a subordinate LOFICs lag signal is determined in response to a difference between the second signal and the first signal,
    wherein an average subordinate LOFICs lag signal is determined in response to a quotient of the subordinate LOFICs lag signal and a number of remaining subordinate LOFICs;
    wherein a main LOFIC lag signal is determined in response to a product of the average subordinate LOFICs lag signal and a capacitor ratio, wherein the capacitor ratio is a ratio of capacitance between the main LOFIC and the subordinate LOFIC of one of the plurality of subordinate capacitor-switch pairs, and
    wherein a lag-free signal is determined in response to a difference between the first signal and the main LOFIC lag signal.

3. The pixel circuit of claim 1, wherein the switch transistor of a first of the plurality of subordinate capacitor-switch pairs is configured to be on and simultaneously switch transistors of remaining subordinate capacitor-switch pairs of the plurality of subordinate capacitor-switch pairs are configured to be off and to be discharging residual image charges during a first frame period.

4. The pixel circuit of claim 3, wherein the switch transistor of a second of the plurality of subordinate capacitor-switch pairs is configured to be on and simultaneously switch transistors of remaining subordinate capacitor-switch pairs of the plurality of subordinate capacitor-switch pairs are configured to be off and to be discharging residual image charges during a second frame period.

5. The pixel circuit of claim 1, wherein the main LOFIC and each subordinate LOFIC of the plurality of subordinate capacitor-switch pairs have the same dielectric composition.

6. The pixel circuit of claim 1, wherein the main LOFIC and each subordinate LOFIC of the plurality of subordinate capacitor-switch pairs have the same dielectric thickness.

7. The pixel circuit of claim 1, wherein the main LOFIC has a greater capacitance area than each subordinate LOFIC of the plurality of subordinate capacitor-switch pairs.

8. The pixel circuit of claim 1, wherein the main LOFIC and each subordinate LOFIC of the plurality of subordinate capacitor-switch pairs have the same biasing scheme during an idle period of a frame.

9. The pixel circuit of claim 8, wherein, wherein the main LOFIC and each subordinate LOFIC of the plurality of subordinate capacitor-switch pairs are reversed biased during the idle period.

10. The pixel circuit of claim 1, wherein the plurality of subordinate capacitor-switch pairs comprises two subordinate capacitor-switch pairs.

11. The pixel circuit of claim 1, wherein the plurality of subordinate capacitor-switch pairs comprises three subordinate capacitor-switch pairs.

12. The pixel circuit of claim 1, wherein the main LOFIC and each of the plurality of subordinate capacitor-switch pairs are coupled to one another in parallel between the reset transistor and the bias voltage source.

13. The pixel circuit of claim 1, wherein the floating diffusion is a first floating diffusion, and wherein the pixel circuit further comprises:
- a second floating diffusion coupled between the first floating diffusion and the reset transistor;
- a dual floating diffusion (DFD) transistor coupled between the first floating diffusion and the second floating diffusion;
- a third floating diffusion coupled between the second floating diffusion and the reset transistor; and
- a LOFIC transistor coupled between the second floating diffusion and the third floating diffusion, wherein the LOFIC network is coupled between the third floating diffusion and the bias voltage source.

14. The pixel circuit of claim 13, further comprising:
- a source follower transistor having a gate coupled to the first floating diffusion; and
- a row select transistor coupled to the source follower transistor, wherein the source follower transistor and the row select transistor are coupled between a power line and a bitline.

15. The pixel circuit of claim 1, wherein the LOFIC network further comprises a main switch transistor coupled to the main LOFIC.

16. A method of operating a pixel circuit, comprising:
during a first frame period—
- photogenerating image charge in a photodiode in response to incident light;
- transferring the image charge from the photodiode to a floating diffusion;
- transferring overflow image charge from the photodiode to a lateral overflow integration capacitor (LOFIC) network of the pixel circuit, wherein the LOFIC network comprises a main LOFIC and a plurality of subordinate capacitor-switch pairs, wherein each of the plurality of subordinate capacitor-switch pairs comprises a subordinate LOFIC and a switch transistor coupled to the subordinate LOFIC in series;
- turning on the switch transistor of a first of the plurality of subordinate capacitor-switch pairs; and
- simultaneously turning off switch transistors of remaining subordinate capacitor-switch pairs of the plurality of subordinate capacitor-switch pairs.

17. The method of claim 16, further comprising:
during the first frame period—
- reading out a first signal, wherein the first signal represents image charge from the main LOFIC and the subordinate LOFIC of a first of the plurality of subordinate capacitor-switch pairs;
- reading out a second signal, wherein the second signal represents image charge from the main LOFIC and the subordinate LOFICs of the plurality of subordinate capacitor-switch pairs;
- subtracting the first signal from the second signal to obtain a subordinate LOFICs lag signal;
- scaling the subordinate LOFICs lag signal based on a number of remaining subordinate LOFICs to obtain an average subordinate LOFICs lag signal;
- multiplying the average LOFICs lag signal by a capacitor ratio to obtain a main LOFIC lag signal, wherein the capacitor ratio is the ratio of capacitance between the main LOFIC and the subordinate LOFIC of one of the plurality of subordinate capacitor-switch pairs; and
- subtracting the main LOFIC lag signal from the first signal to obtain a lag-free signal.

18. The method of claim 17, further comprising:
during a second frame period—
- turning on the switch transistor of a second of the plurality of subordinate capacitor-switch pairs; and
- simultaneously turning off switch transistors of remaining subordinate capacitor-switch pairs of the plurality of subordinate capacitor-switch pairs.

19. The method of claim 17, wherein the capacitor ratio is the ratio of capacitance area between the main LOFIC and the subordinate LOFIC of one of the plurality of subordinate capacitor-switch pairs.

20. The method of claim 16, wherein the main LOFIC and each subordinate LOFIC of the plurality of subordinate capacitor-switch pairs have the same dielectric composition, the same dielectric thickness, and/or the same biasing scheme, and wherein the main LOFIC has a greater capacitance area than each subordinate LOFIC of the plurality of subordinate capacitor-switch pairs.

* * * * *